US007776690B2

(12) United States Patent
Han et al.

(10) Patent No.: US 7,776,690 B2
(45) Date of Patent: Aug. 17, 2010

(54) METHOD OF FORMING A CONTACT ON A SEMICONDUCTOR DEVICE

(75) Inventors: Tzung-Ting Han, Hsinchu (TW);
Ming-Shang Chen, Hsinchu (TW);
Wen-Pin Lu, Hsinchu (TW);
Meng-Hsuan Weng, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 598 days.

(21) Appl. No.: 11/691,501

(22) Filed: Mar. 27, 2007

(65) Prior Publication Data
US 2007/0190719 A1 Aug. 16, 2007

Related U.S. Application Data

(63) Continuation of application No. 10/904,703, filed on Nov. 24, 2004, now Pat. No. 7,214,983.

(51) Int. Cl.
*H01L 21/336* (2006.01)
(52) U.S. Cl. ................... 438/261; 257/E21.679
(58) Field of Classification Search ......... 438/257–258, 438/314–317, 584–585, 593
See application file for complete search history.

(56) References Cited

U.S. PATENT DOCUMENTS

| 6,087,710 | A | * | 7/2000 | Eimori et al. | 257/649 |
| 6,387,814 | B1 | * | 5/2002 | Chen | 438/700 |
| 6,624,460 | B1 | * | 9/2003 | Huang et al. | 257/296 |
| 2002/0020871 | A1 | * | 2/2002 | Forbes | 257/315 |
| 2003/0122204 | A1 | * | 7/2003 | Nomoto et al. | 257/406 |
| 2005/0140002 | A1 | * | 6/2005 | Shin et al. | 257/734 |

* cited by examiner

*Primary Examiner*—Chandra Chaudhari
(74) *Attorney, Agent, or Firm*—Jianq Chyun IP Office

(57) ABSTRACT

A method of forming a contact on a semiconductor device is provided. First, a substrate is provided. A plurality of gate structures defined by a plurality of word lines in a first direction, and a plurality of diffusion regions covered by a first dielectric layer in a second direction are provided over the substrate. The gate structures located underneath the word lines and isolated by the diffusion regions. Then, an etching stop layer is formed. The etching stop layer and the first dielectric layer have different etching selectivity. A second dielectric layer is formed over the substrate. Furthermore, a plurality of contact holes to the diffusion regions between the word lines are formed by using the etching stop layer as a self-aligned mask.

13 Claims, 10 Drawing Sheets

METHOD OF FORMING A CONTACT ON A SEMICONDUCTOR DEVICE

CROSS-REFERENCE TO RELATED APPLICATION

This application is a continuation application of a prior application Ser. No. 10/904,703, filed Nov. 24, 2004. All disclosure of the U.S. application is incorporated herein by reference.

BACKGROUND OF THE INVENTION

1. Field of the Invention

The present invention relates to a memory device and fabricating method thereof. More particularly, the present invention relates to a method of forming a contact on a semiconductor device.

2. Description of the Related Art

Non-volatile memory is a type of memory that permits multiple data writing, reading and erasing operations. Moreover, the stored data will be retained even after power to the device is removed. With these advantages, non-volatile memory has become one of the most widely adopted memory devices for personal computer and electronic equipment. Furthermore, non-volatile memory also has the advantages of occupying a small volume, having a fast access speed and consuming very little power. In addition, data can be erased in a block-by-block fashion so that the operating speed is further enhanced.

A typical non-volatile memory comprises an array of memory cells. The horizontally laid memory cells are serially connected through a word line and the vertically laid memory cells are serially connected through a bit line. In general, the strip-like source/drain regions buried within the substrate serve the bit lines. However, because the source/drain regions are buried within the substrate, contacts are required to connect the source/drain regions electrically with an external circuit. In the process of forming such contacts, problems resulting from a misalignment between the contacts and the source/drain regions must be avoided. Although the misalignment problem can be ameliorated through an increase in the width of the source/drain regions, this also increases the size of each device as well. Hence, from the point of view of device integration, this is no a solution.

SUMMARY OF THE INVENTION

Accordingly, the present invention provides a method of forming a contact on a semiconductor device capable of resolving the misalignment problem in the conventional process of forming contacts.

To achieve these and other advantages and in accordance with the purpose of the invention, as embodied and broadly described herein, the invention provides a method of forming a contact on a semiconductor device. First, a substrate is provided. A plurality of gate structures defined by a plurality of word lines in a first direction, and a plurality of diffusion regions covered by a first dielectric layer in a second direction are provided over the substrate. The gate structures located underneath the word lines and isolated by the diffusion regions. Then, an etching stop layer is formed. The etching stop layer and the first dielectric layer have different etching selectivity. A second dielectric layer is formed over the substrate. Furthermore, a plurality of contact holes to the diffusion regions between the word lines are formed by using the etching stop layer as a self-aligned mask.

In the present invention, the etching stop layer and the first dielectric layer have different etching selectivity. Hence, the etching stop layer on the sidewalls of the first dielectric layer is able to provide a better protection in the process of forming the contact openings. In other words, the etching stop layer permits the fabrication of self-aligned contacts. Therefore, the problem of having a misalignment between the contact and the source/drain region is resolved so that the contact can have a larger processing window.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
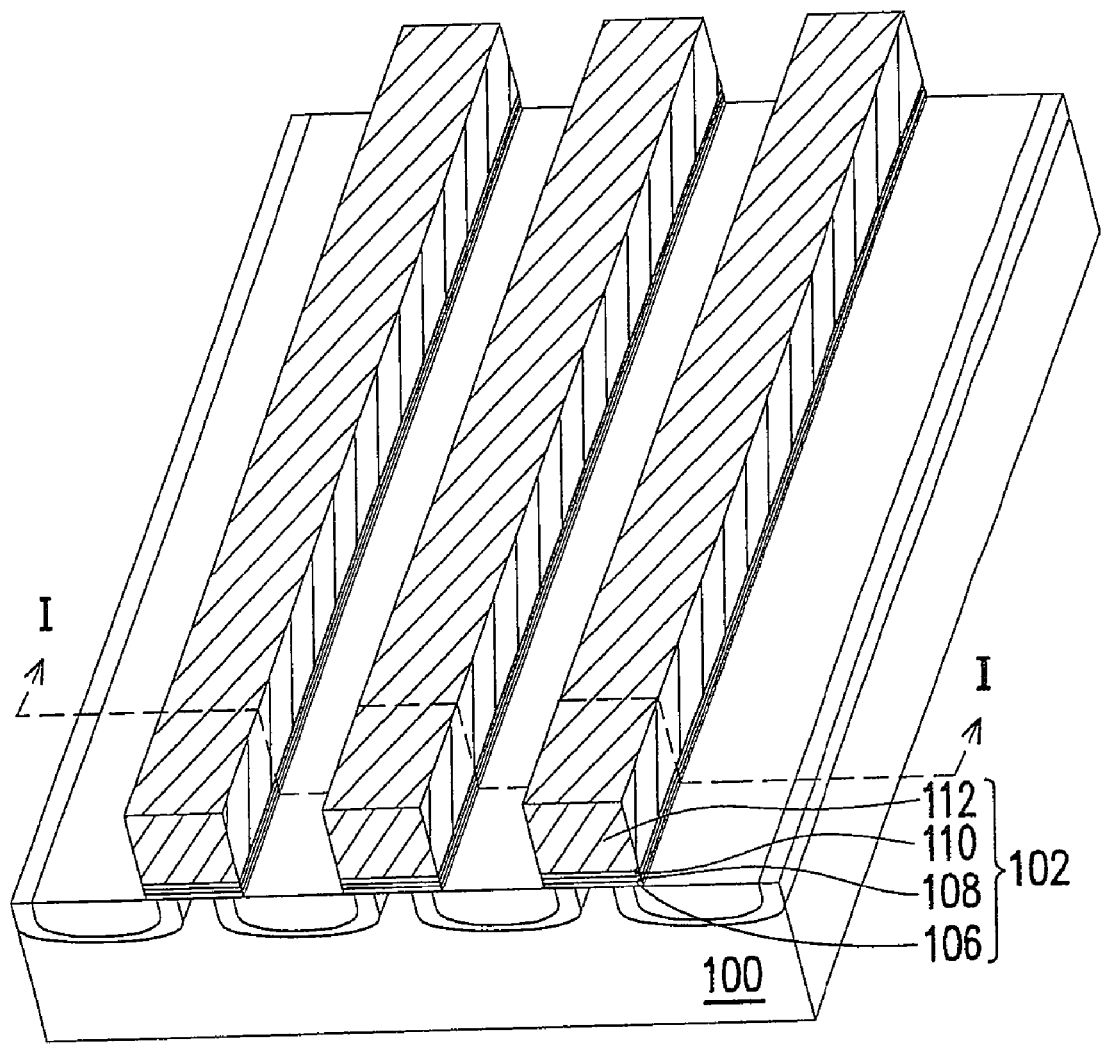
FIGS. 1A through 1E are perspective views showing the steps for fabricating a non-volatile memory according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The invention provides a method of forming a contact on a semiconductor device. First, a substrate is provided. A plurality of gate structures defined by a plurality of word lines in a first direction, and a plurality of diffusion regions covered by a first dielectric layer in a second direction are provided over the substrate. The gate structures located underneath the word lines and isolated by the diffusion regions. Then, an etching stop layer is formed. The etching stop layer and the first dielectric layer have different etching selectivity. A second dielectric layer is formed over the substrate. Furthermore, a plurality of contact holes to the diffusion regions between the word lines are formed by using the etching stop layer as a self-aligned mask.

In the following preferred embodiment of the present invention, the semiconductor device is, for example, a non-volatile memory. The gate structures are, for example, stack gate strips. Each one of the gate structures includes a bottom dielectric layer, a charge storage layer and a top dielectric layer. The bottom dielectric layer is, for example, a tunneling layer. The charge storage layer is, for example, a charge trapping layer or a floating gate layer. The top dielectric layer is, for example, a charge barrier layer or an inter-gate dielectric layer. The diffusion regions are, for example, source/drain regions. The etching stop layer, for example, spacers.

The terms of "non-volatile memory", "stack gate strips", "spacers" and "source/drain regions" in the following preferred embodiment are just examples of "semiconductor device", "gate structures", "etching stop layer" and "diffusion regions" of this invention. However, these terms are not used to limit the scope of this invention.

FIGS. 1A through 1E are perspective views showing the steps for fabricating a non-volatile memory according to one preferred embodiment of the present invention. As shown in FIG. 1A, a bottom dielectric layer 106, a charge storage layer 108, a top dielectric layer 110, a control gate layer 112 and a mask layer (not shown) are sequentially formed over a substrate 100. Thereafter, the film layers are patterned to form a plurality of stack gate strips 102 and a plurality of mask strip layers (not shown). Each stack gate strip 102 comprises a bottom dielectric layer 106, a charge storage layer 108, a top dielectric layer 110 and a control gate layer 112 sequentially stacked over the substrate 100. The mask strip layers are removed in a subsequent operation. In one preferred embodiment, the bottom dielectric layer 106 is a tunneling layer fabricated using silicon oxide material, for example. The charge storage layer 108 is a charge-trapping layer fabricated using silicon nitride material, for example. The top dielectric layer 110 is a charge barrier layer fabricated using silicon oxide material, for example. The control gate layer is a doped polysilicon layer, for example. Thus, a silicon nitride memory is formed. In another preferred embodiment, the bottom dielectric layer 106 is a tunneling layer fabricated using silicon oxide material, for example. The charge storage layer 108 is a floating gate layer fabricated using doped polysilicon material, for example. The top dielectric layer 110 is an inter-gate dielectric layer fabricated using silicon oxide material or silicon oxide/silicon nitride/silicon oxide (ONO) multi-layer material, for example. The control gate layer 112 is fabricated from doped polysilicon. Thus, a flash memory is formed.

Thereafter, a plurality of source/drain regions 104 is formed in the substrate 100 on each side of the stack gate strips 102. In one preferred embodiment, a pocket-doped region 114 is also formed underneath the source/drain regions 104.

Figure 1B:
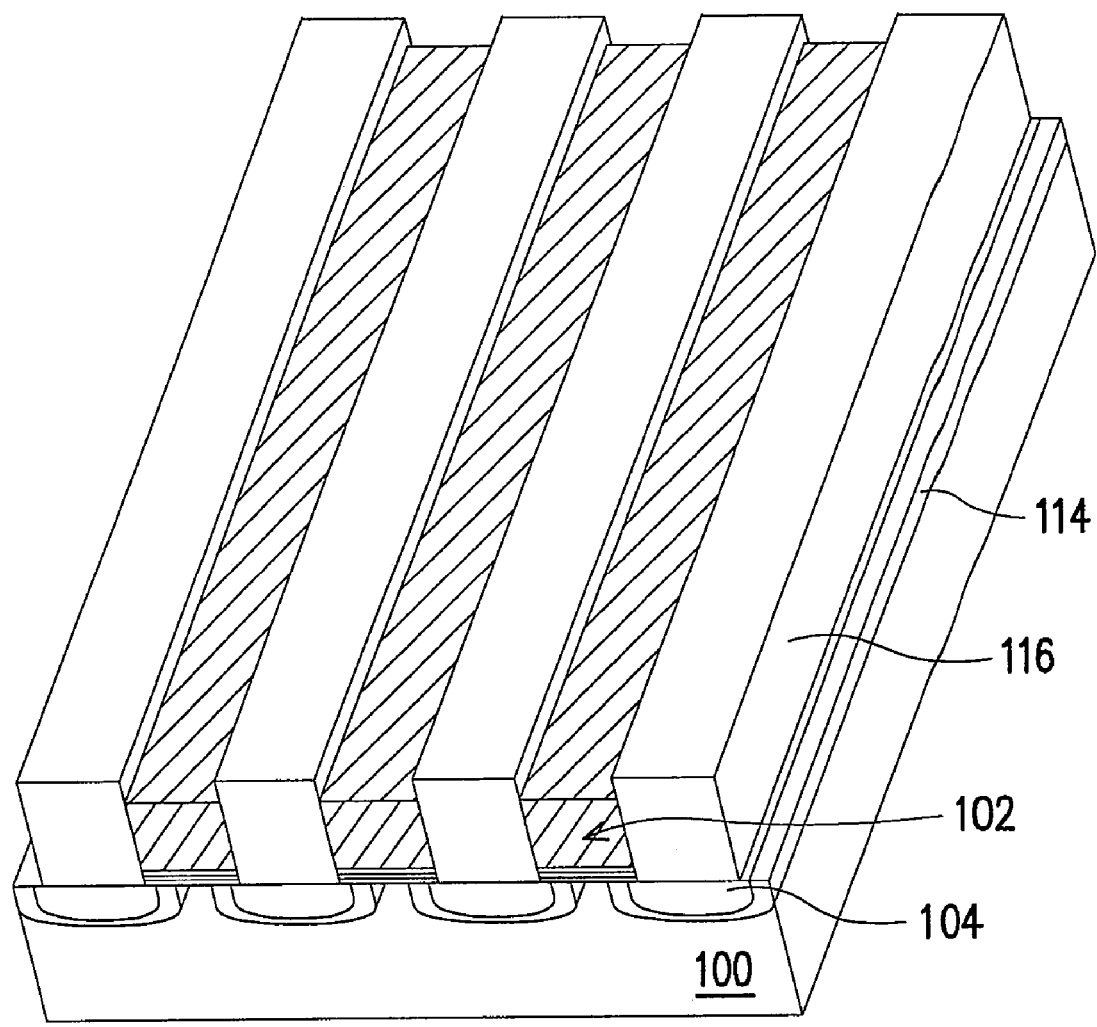

As shown in FIG. 1B, a plurality of dielectric strips 116 is formed between the stack gate strips 102 above the source/drain regions 104. The sidewalls of the dielectric strips 116 are perpendicular to the substrate 100. In one preferred embodiment, the height of the dielectric strips 116 is greater than the height of the stack gate strips 102. In addition, the dielectric strips 116 are fabricated using a silicon oxide material, for example.

Figure 2A:
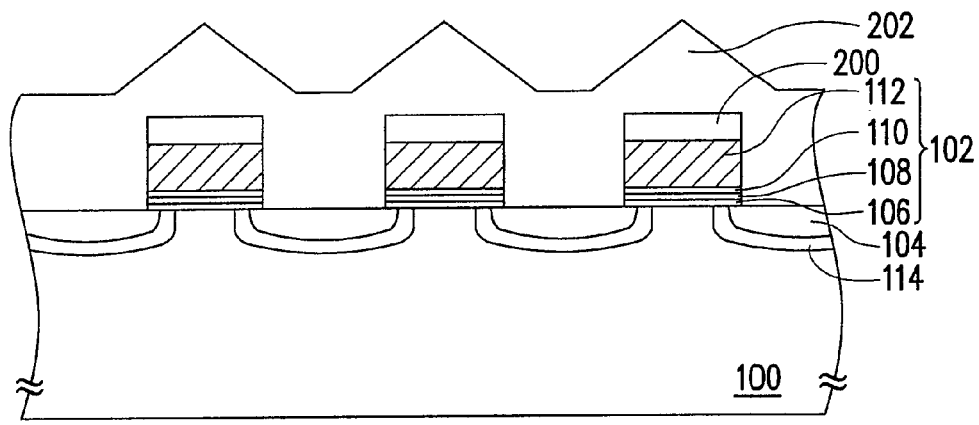
FIGS. 2A through 2C are schematic cross-sectional views along line I-I' of FIG. 1A showing some of the steps in the fabrication of a non-volatile memory according to one preferred embodiment of the present invention.
Figure 2B:
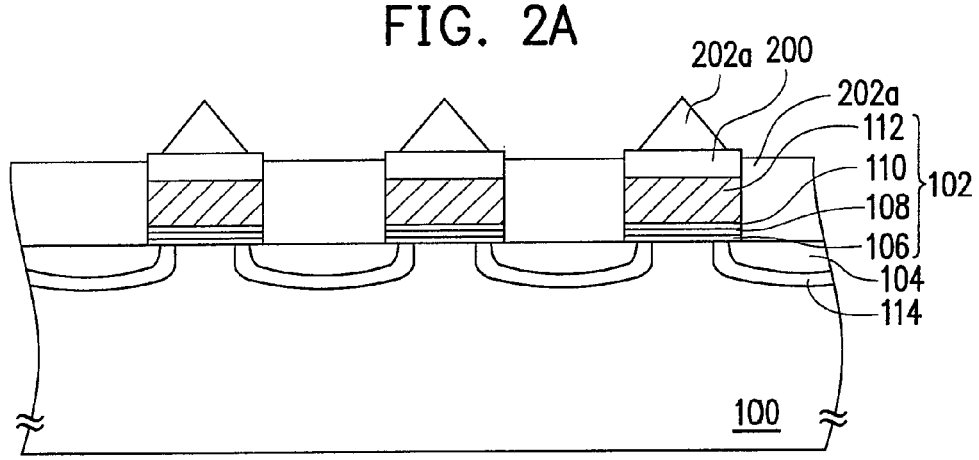
Figure 2C:
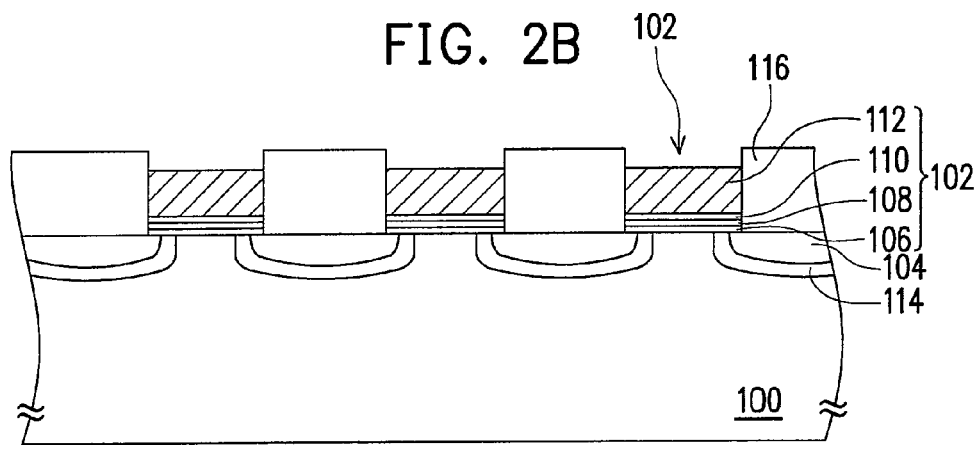

In one preferred embodiment, the steps for forming the aforementioned dielectric strips 116 are shown in the cross-sectional views (along line I-I' of FIG. 1A) of FIGS. 2A through 2C. First, as shown in FIG. 2A, a plurality of mask strip layers 200 is formed over the stack gate strips 102. The mask strip layers 200 are silicon nitride layers formed, for example, by patterning the silicon nitride layer together with the stack gate strips 102. Thereafter, a dielectric material layer 202 is formed over the substrate to cover the mask strip layers 200 but expose the substrate 100. The dielectric material layer 202 is fabricated using a material having an etching selectivity that differs from the mask strip layers 200 such as silicon oxide. The dielectric material layer 202 is formed, for example, by performing a high-density plasma chemical vapor deposition (HDPCVD) process. Thereafter, as shown in FIG. 2B, a portion of the dielectric material layer 202 above the mask strip layers 200 is removed to expose a portion of the mask strip layers 200 so that a dielectric material layer 202a between the stack gate strips 102 is retained. The method of removing a portion of the dielectric material layer 202 includes etching with hot phosphoric acid until the top corners of the mask strip layers 200 are exposed. As shown in FIG. 2C, the mask strip layer 200 and the overlying dielectric material layer 202a are removed to form the dielectric strips 116.

The method described with the help of FIGS. 2A through 2C is just one of the methods for forming the dielectric strips 116 and should by no means limit the scope of the present invention. In other words, other suitable methods can be used to form the dielectric strips 116 whose sidewalls are perpendicular to the substrate 100 in another embodiment.

Figure 1C:
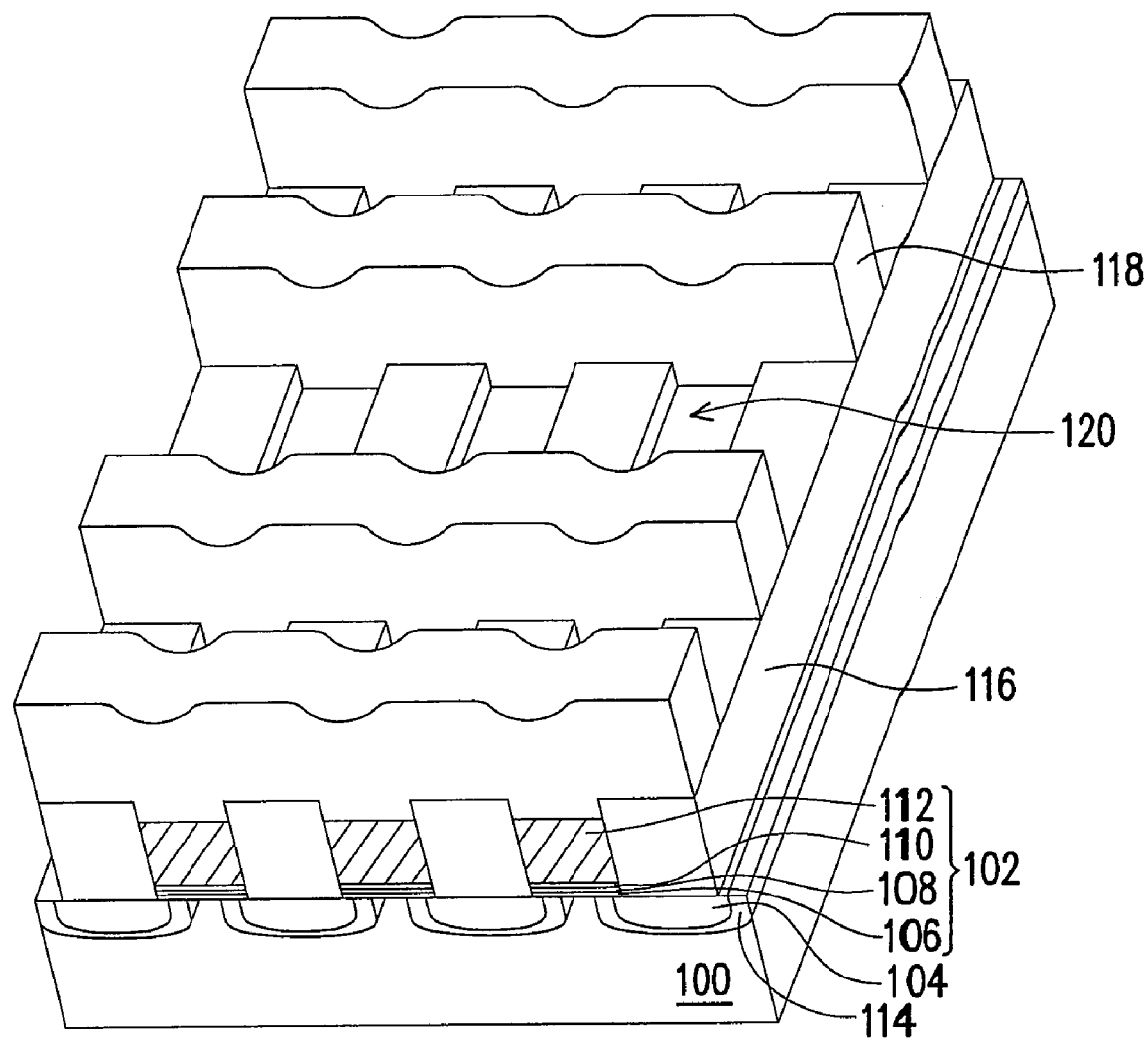

As shown in FIG. 1C, a plurality of word lines is formed over the stack gate strips 102 and the dielectric strips 116. The word lines 118 cross over the stack gate strips 102 and the dielectric strips 116 perpendicularly. The word lines 118 are formed, for example, by performing a chemical vapor deposition process to form a word line material layer (not shown) and then patterned the word line material layer.

Thereafter, the stack gate strips 102 not covered by the word lines 118 is removed to form a plurality of openings 120 between the exposed dielectric strips 116 and form a plurality of stack gate structures 102a. It should be noted that the openings 120 are formed in areas between neighboring memory cell arrays. In one preferred embodiment, if the charge storage layer 108 is fabricated using a conductive material, the film layer above the charge storage layer 108 and the charge storage layer 108 must be removed. In another preferred embodiment, if the charge storage layer 108 is fabricated using a non-conductive material, only the control gate layer needs to be removed.

Figure 1D:
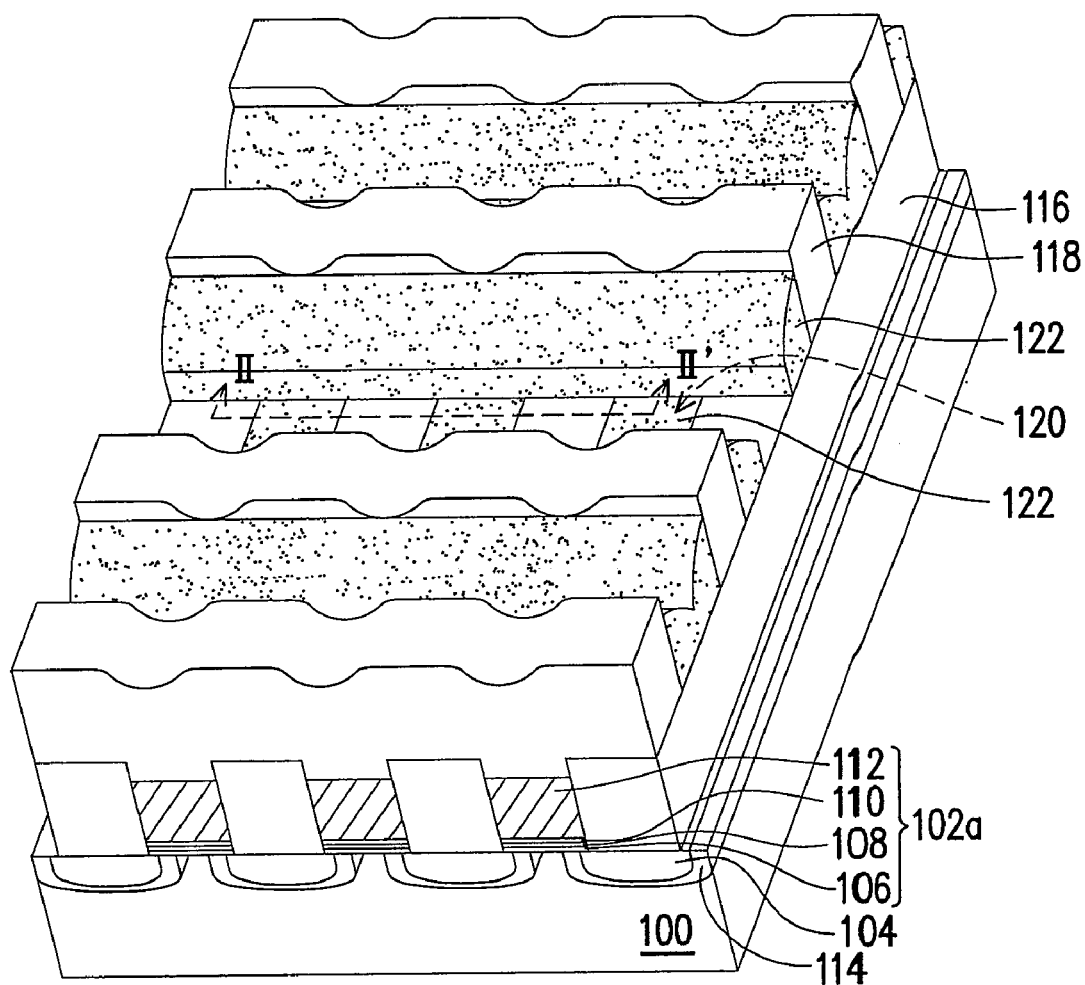
Figure 3:
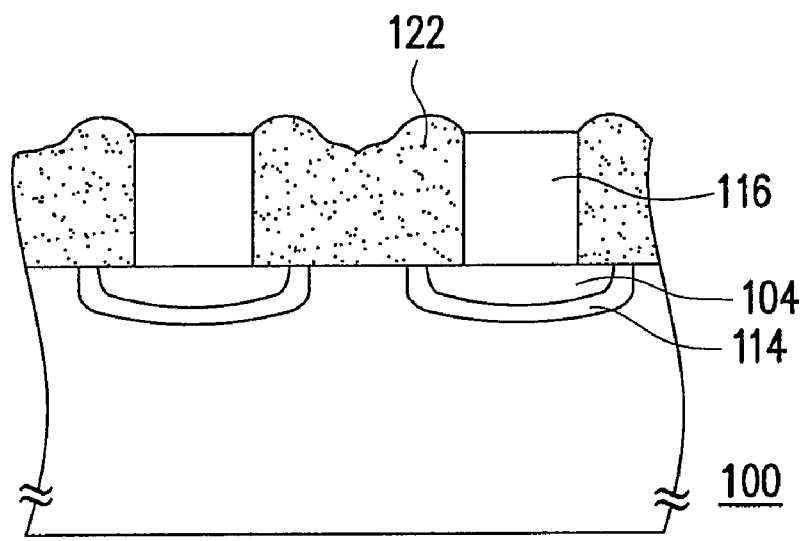
FIG. 3 is a schematic cross-sectional view along line II-II' of FIG. 1D.

As shown in FIG. 1D, a plurality of spacers 122 is formed the sidewalls of the dielectric strips 116 exposed through the openings 120 and the sidewalls of the word lines 118. The spacers 122 and the dielectric strips 116 have different etching selectivity. The spacers 122 are fabricated using silicon nitride material, silicon oxynitride material or other suitable material. The spacers 122 are formed, for example, by forming a spacer material layer (not shown) over the substrate 100 to cover the exposed word lines 118 and the dielectric strip 116 and fill the openings 120. Thereafter, an isotropic etching operation is carried out to remove a portion of the spacer material layer and form the spacers 122. In the process of removing a portion of the spacer material layer because a portion of the spacer material layer within the openings 120 is a lower layer relative to the word lines 118, only a portion of the spacer material layer is removed. Thus, the two spacers 122 opposite each other within the opening 120 are adjacent. FIG. 3 is a schematic cross-sectional view along line II-II' of FIG. 1D.

Thereafter, a dielectric layer (not shown) is formed over the substrate 100 to cover the word lines 118, the spacers 122 and the dielectric strips 116.

Figure 1E:
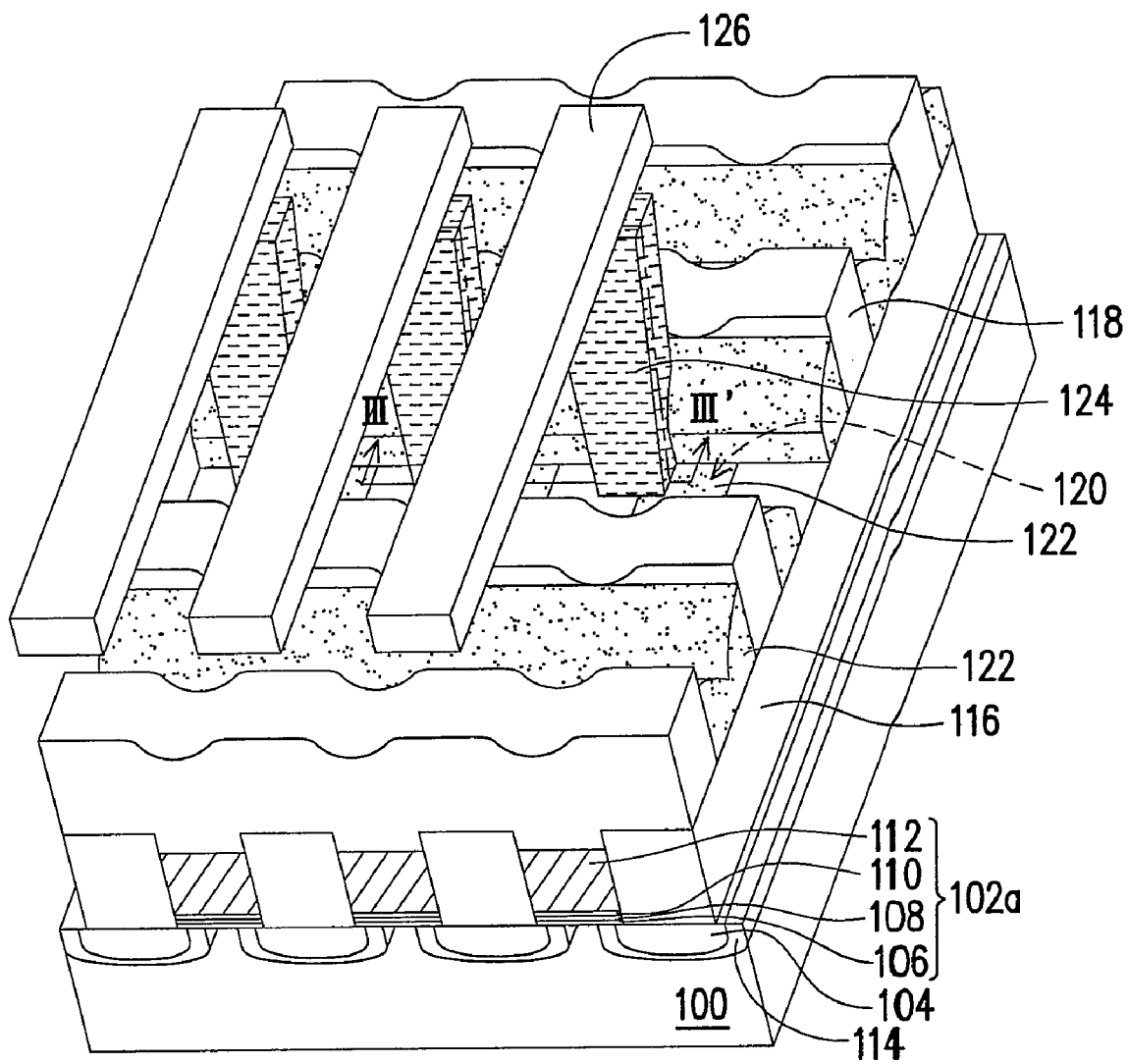

As shown in FIG. 1E, a plurality of contacts 124 is formed in the dielectric layer and the dielectric strips 116 between neighboring word lines 118. The contacts 124 are formed using the spacers 122 as a self-aligned mask. Furthermore, each contact 124 is electrically connected to a corresponding source/drain region 104. The contacts 124 are formed, for example, by forming contact openings (not shown) in the dielectric layer and the dielectric strips 116 to expose the source/drain regions 104 and then filling the contact opening with a conductive material.

It should be noted that the areas for forming the contact openings have spacers 122 formed in both the X and the Y direction. For example, spacers 122 aligned in the X-direction are formed on the sidewalls of the dielectric strips 116 and spacers 122 aligned in the Y-direction are formed on the sidewalls of the word lines 118. Furthermore, the spacers 122 have an etching selectivity different from the dielectric strips 116. In the process of forming the contact openings, any misalignment in the mask may result little damage to the spacers. However, the damage will have no chance of causing a short circuit in the contact. Therefore, under the protection of the spacers 122, contacts 124 are formed in a self-aligned process whose accuracy is minimally affected by misalignment.

Figure 4:
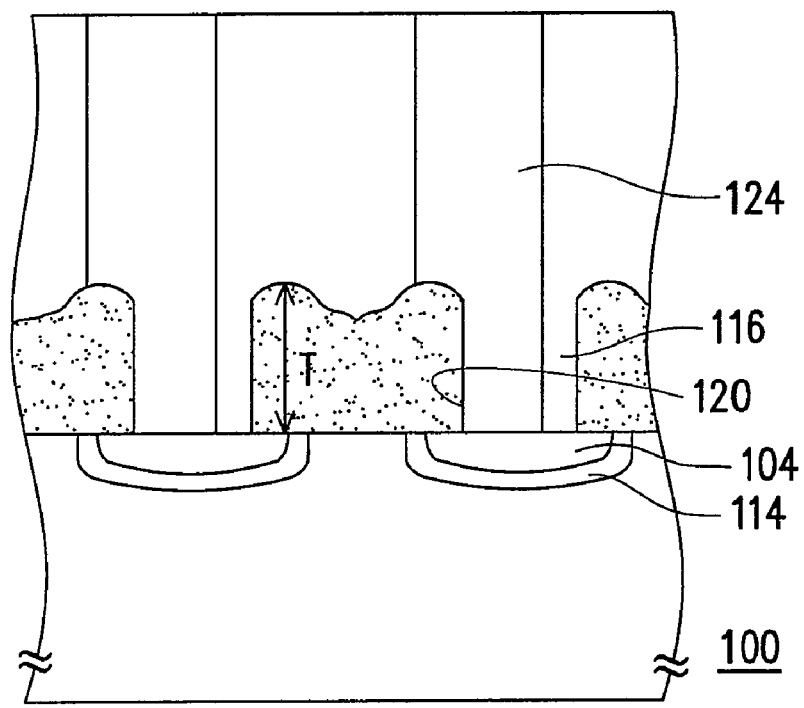
FIG. 4 is a schematic cross-sectional view along line III-III' of FIG. 1E.

FIG. 4 is a schematic cross-sectional view along line III-III' of FIG. 1E. Although a portion of the misaligned contact 124 cover the spacer 122 within the opening 120 as shown in FIG. 4, this will not lead to a short circuit of the contact 124. Furthermore, to enhance the protective capacity of the spacers and improve the processing window, spacers 122 (as shown in FIG. 4) having a greater thickness T and connected together inside the opening 120 can be formed. The method of forming a thicker spacer 122 includes shortening the area (the channel region) between the source/drain regions 104 in the step shown in FIG. 1A or forming a dielectric strip 116 having a greater step height in the step shown in FIG. 1B. In particular, shortening the area (the channel region) between the source/drain regions 104 not only produces improved spacers, but also reduces the dimension of each device and increases the degree of integration of the memory devices.

After forming the contacts 124, conductive layers 126 may also be formed over the dielectric layer such that each conductive layers 126 is electrically connected to a corresponding contact 124.

In the present invention, sidewall spacers are formed inside the openings between neighboring dielectric strips. Furthermore, the spacers and the dielectric strips have different etching selectivity. Hence, the spacers on the sidewalls of the dielectric strips are able to provide a better protection in the process of forming the contact openings. In other words, the spacers permit the fabrication of self-aligned contacts. Therefore, the problem of having a misalignment between the contact and the source/drain region is resolved so that the contact can have a larger processing window.

Furthermore, because the step for forming the contacts has a higher processing window, width of the source/drain regions and the overlying dielectric strips can be reduced leading to a smaller size device and a higher level of integration.

In addition, spacers having an increased thickness is formed inside the openings. Therefore, a subsequently formed silicide layer is prevented from forming a contact with the substrate around this areas leading to a possible short circuit with a neighboring source/drain region.

In the following, a non-volatile memory structure fabricated using the aforementioned method is described. As shown in FIG. 1E, the non-volatile memory structure comprises a substrate 100, a plurality of columns of source/drain regions 104, a plurality of columns of dielectric strips 116, a plurality of rows of word lines 118, a plurality of stack gate structures 102a, a plurality of etching stopped layer (spacers) 122, a dielectric layer and a plurality of contacts 124.

The columns of source/drain regions 104 are disposed within the substrate 100. The columns of dielectric strips 116 are disposed over the source/drain regions 104. The rows of word lines 118 are disposed over the dielectric strips 116 such that the word lines 118 cross over the dielectric strips 116 perpendicularly.

The stack gate structures 102a form a plurality of columns with each column of stack gate structures 102a disposed between the word lines 118 and the substrate 100 and between the dielectric strips 116. Each stack gate structure 102a comprises a bottom dielectric layer 106, a charge storage layer 108, a top dielectric layer 110 and a control gate layer 112 sequentially stacked over the substrate 100.

The etching stopped layers 122 are disposed on the substrate 100 between neighboring columns of stack gate structures 102a and between the dielectric strips 116. The sidewalls of the etching stopped layers 122 are perpendicular to the substrate 100. Furthermore, the etching stopped layers 122 and the dielectric strips 116 have different etching selectivity. The etching stopped layer 122 is fabricated using silicon nitride, silicon oxynitride or other suitable material. The dielectric strips 116 are fabricated using silicon oxide material, for example. In one preferred embodiment, the etching stopped layers 122 are also disposed on the sidewalls of the word lines 118 beside the areas between the dielectric strips 116.

The dielectric layer (not shown) covers the dielectric strips 116, the word lines 118 and the etching stopped layer 122. The contacts 124 are disposed in the dielectric layer and the dielectric strips 116 between neighboring rows of word lines 118 and a portion of the contacts 124 are disposed to cover the etching stopped layers 122 (as shown in FIG. 4) on each side of the dielectric strips 116. Furthermore, each contact 124 is electrically connected to a corresponding source/drain region 104.

In addition, the non-volatile memory may further comprises a plurality of conductive layers 126 disposed over the dielectric layer and electrically connected to corresponding contacts 124.

In the present invention, etching stopped layers are formed between neighboring dielectric strips. Furthermore, the etching stopped layers and the dielectric strips have different etching selectivity. Hence, the misalignment of the contacts in the process of forming the contacts in the dielectric layer and the dielectric strips is largely avoided. In other words, width of the source/drain regions and the overlying dielectric strips can be reduced to increase overall level of integration.

Figure 5A:
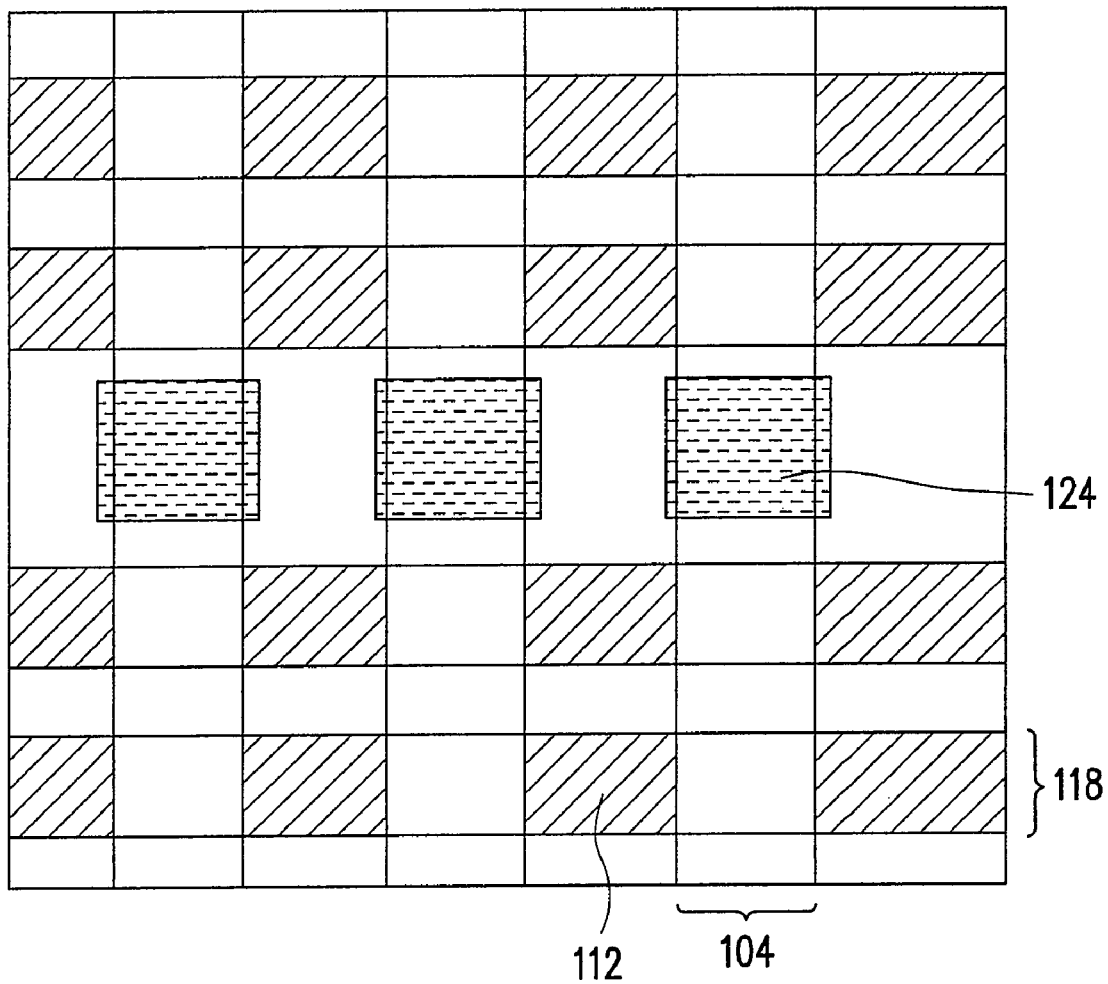
FIG. 5A is a top view showing the layout of a virtual ground type non-volatile memory.
Figure 5B:
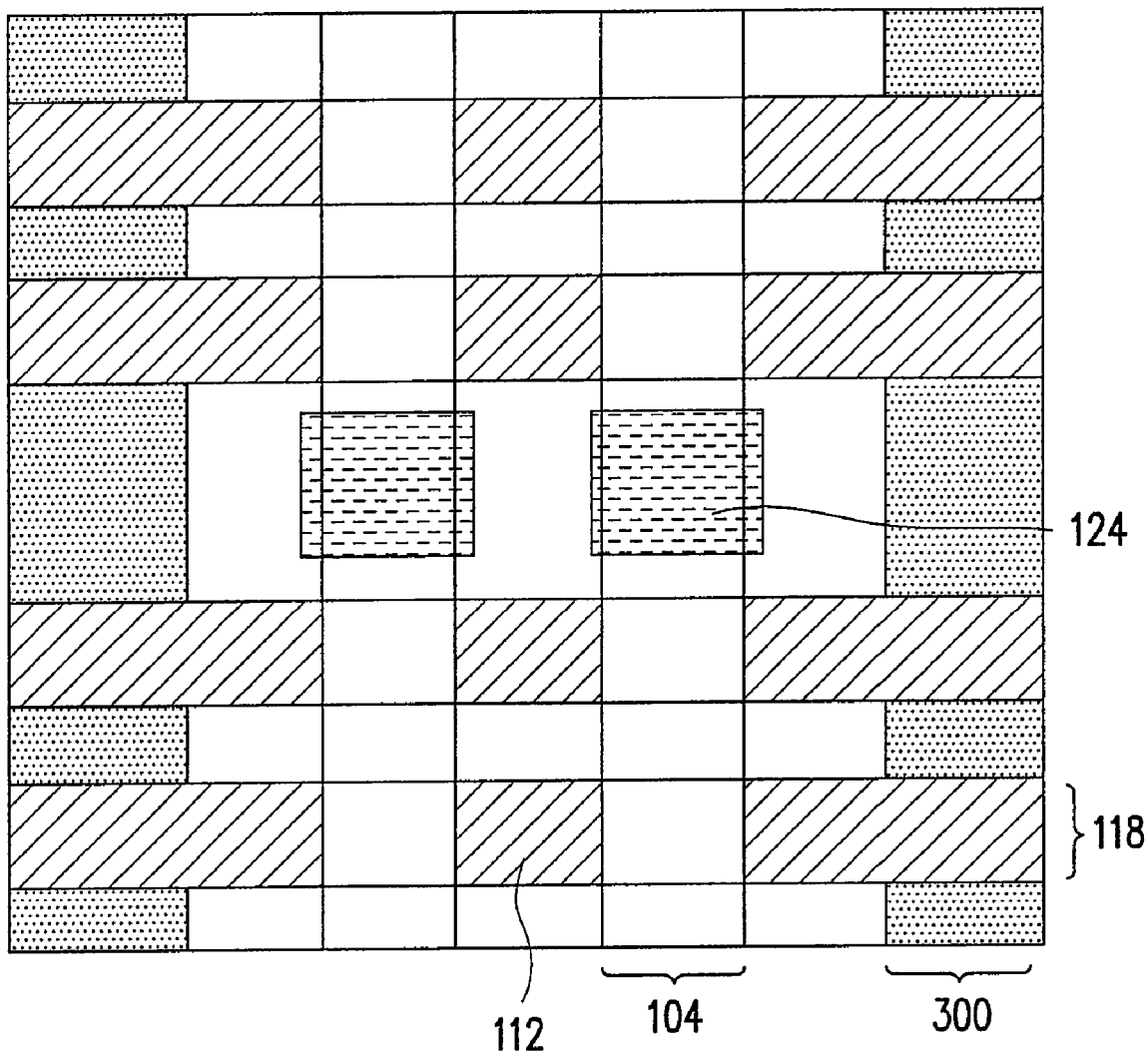
FIG. 5B is a top view showing the layout of another type non-volatile memory.
Figure 6:
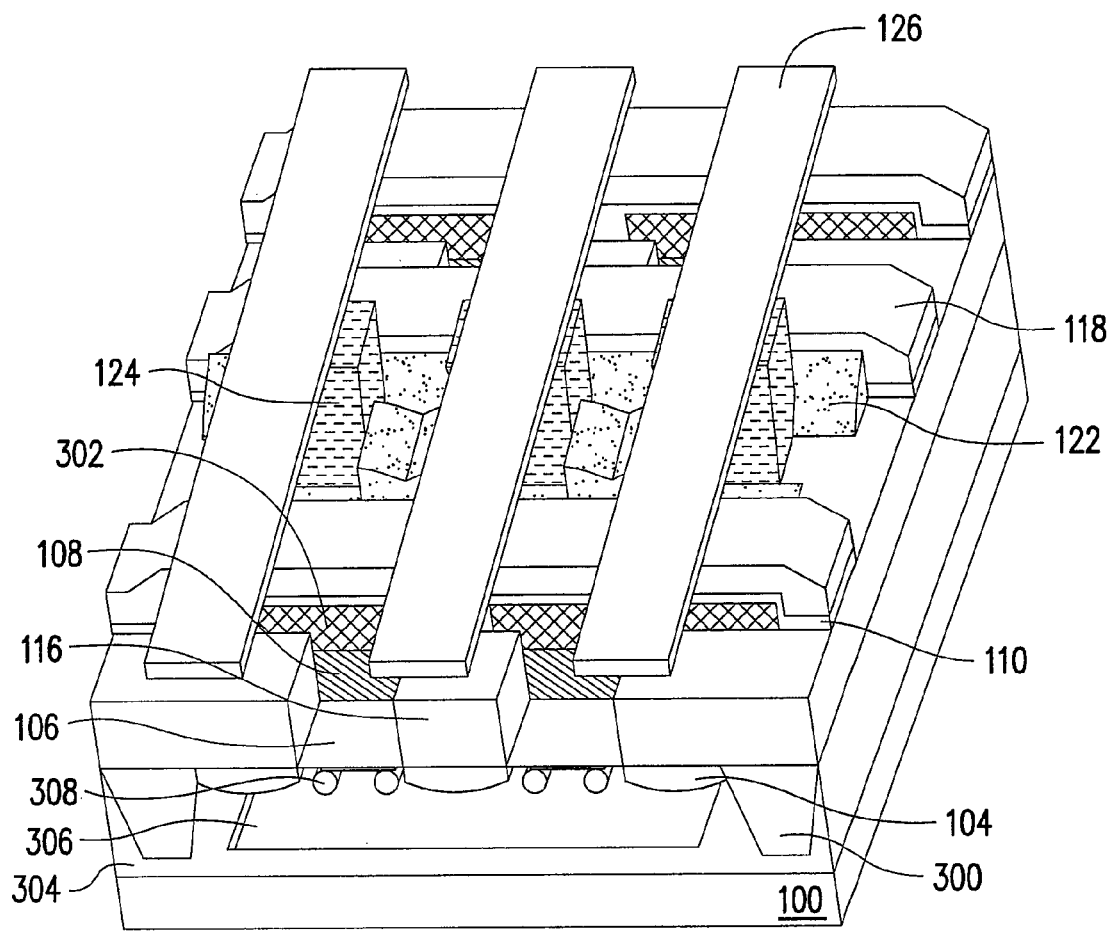
FIG. 6 is a perspective view of a non-volatile memory in FIG. 5B according to another preferred embodiment of the present invention.

The aforementioned non-volatile memory and fabricating method thereof can be applied to produce a virtual ground type and another type memory. FIG. 5A is a top view showing the layout of a virtual ground type non-volatile memory. FIG. 5B is a top view showing the layout of another type non-volatile memory. One major difference between these two types of memories is whether isolation structures 300 are disposed inside the memory or not. FIG. 6 is a perspective view of a non-volatile memory in FIG. 5B according to another preferred embodiment of the present invention. As shown in FIG. 6, the charge storage layer 108 is a floating gate layer. To increase the coupling ratio between the charge storage layer 108 and the top dielectric layer 110, another floating gate layer 302 is normally disposed between the charge storage layer 108 and the top dielectric layer 110. In addition, the area labeled 304 in FIG. 6 refers to an N-type well, the area labeled 306 refers to a P-type well for the memory cell array, and the area labeled 308 refers to an anti-punch region.

In summary, major advantages of the present invention includes:

1. Sidewall spacers are formed inside the openings between neighboring dielectric strips. Furthermore, the spacers and the dielectric strips have different etching selectivity. Hence, the problem of having a misalignment between the contact and the source/drain region is resolved so that the method of fabricating contacts can have a larger processing window.

2. Because the step for forming the contacts has a higher processing window, width of the source/drain regions and the overlying dielectric strips can be reduced leading to a smaller size device and a higher level of integration.

3. Because the spacers having an increased thickness is formed inside the openings, the subsequently formed silicide layer is prevented from forming a contact with the substrate around these areas to produce a short circuit connection with a neighboring source/drain region.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a contact on a semiconductor device, comprising;
   providing a substrate;
   providing a plurality of gate structures defined by a plurality of word lines in a first direction, and a plurality of diffusion regions covered by a first dielectric layer in a second direction over the substrate, wherein the gate structures located underneath the word lines and isolated by the diffusion regions;
   forming an etching stop layer, wherein the etching stop layer and the first dielectric layer have different etching selectivity;
   forming a second dielectric layer over the substrate; and
   forming a plurality of contact holes to the diffusion regions between the word lines by using the etching stop layer as a self-aligned mask.

2. The method of claim 1, wherein the first dielectric layer has a height greater than the gate structures.

3. The method of claim 1, wherein the contact covers a portion of the etching stop layer.

4. The method of claim 1, wherein the material constituting the etching stop layer comprises silicon nitride or silicon oxynitride.

5. The method of claim 1, wherein the material constituting the first dielectric layer comprises silicon oxide.

6. The method of claim 1, wherein after the step of forming the gate structures, further comprises forming a mask strip layer over the gate structures.

7. The method of claim 6, wherein the step of forming the first dielectric layer comprises:
   forming a dielectric material layer over the substrate;
   removing a portion of the dielectric material layer above the mask strip layer until a portion of the mask strip layer is exposed and the dielectric material layer between the gate structures is retained; and
   removing the mask strip layer.

8. The method of claim 7, wherein the step of forming the dielectric material layer comprises performing a high-density plasma chemical vapor deposition (HDPCVD) process.

9. The method of claim 7, wherein the step of removing a portion of the dielectric material layer comprises etching with hot phosphoric acid until the top corners of the mask strip layer are exposed.

10. The method of claim 1, wherein the step of forming the etching stop layer comprises:
    forming an etching stop material layer over the substrate to cover the word lines and the dielectric strips and fill openings between the word lines; and
    performing an anisotropic etching operation to remove a portion of the etching stop material layer.

11. The method of claim 1, wherein each of the gate structures comprises a bottom dielectric layer, a charge storage layer and a top dielectric layer.

12. The method of claim 11, wherein the bottom dielectric layer comprises a tunneling layer, the charge storage layer comprises a charge trapping layer, and the top dielectric layer comprises a charge barrier layer.

13. The method of claim 11, wherein the bottom dielectric layer comprises a tunneling layer, the charge storage layer comprises a floating gate layer, and the top dielectric layer comprises an inter-gate dielectric layer.

* * * * *